United States Patent
Magera et al.

Patent Number: 5,545,430
Date of Patent: Aug. 13, 1996

[54] METHOD AND REDUCTION SOLUTION FOR METALLIZING A SURFACE

[75] Inventors: Yaroslaw A. Magera, Palatine; Jovica Savic, Downers Grove; Vernon L. Brown, Barrington, all of Ill.

[73] Assignee: Motorola, Inc., Schaumburg, Ill.

[21] Appl. No.: 348,697

[22] Filed: Dec. 2, 1994

[51] Int. Cl.$^6$ .............. B05D 5/12; B05D 3/09; B05D 3/10; B05D 1/18
[52] U.S. Cl. ............. 427/98; 427/305; 427/437
[58] Field of Search ............. 427/98, 305, 437

[56] References Cited

U.S. PATENT DOCUMENTS

| | | | |
|---|---|---|---|
| 4,002,778 | 1/1977 | Bellis et al. | 427/437 |
| 4,450,190 | 5/1984 | Nuzzi et al. | 427/305 |
| 4,590,115 | 5/1986 | Cassat | 428/174 |
| 5,162,144 | 11/1992 | Brown et al. | 428/209 |
| 5,260,170 | 11/1993 | Brown | 430/315 |

FOREIGN PATENT DOCUMENTS

| | | | |
|---|---|---|---|
| 4-96293 | 3/1992 | Japan | 427/98 |
| 2126608 | 3/1984 | United Kingdom | 427/305 |

Primary Examiner—Charles L. Bowers, Jr.
Assistant Examiner—J. Pasterczyk
Attorney, Agent, or Firm—Donald C. Kordich; Douglas D. Fekete

[57] ABSTRACT

A method for metallizing selected areas of a two dielectric layered sequentially processed circuit board (100) involves exposing the resin A (204) by photo-definition. The resin A (204) contains 10% or less, by weight $Cu_2O$ particles (300) mixed uniformly throughout the resin. The circuit board (100) is sprayed with a reduction solution to form catalytic islands (301) predominately of $Cu^0$ or CuH. The circuit board (100) is then electrolessly plated to form conductors, pads or vias, where the resin A (204) has been exposed. The reduction solution includes a primary reducing agent, a secondary reducing agent and a capturing agent. The reduction solution preferably has a pH of 10 or greater. The primary reducing agent is preferably a borohydride. The secondary reducing agent is preferably an iodide and the capturing agent is a chelating agent preferably EDTA.

6 Claims, 2 Drawing Sheets

METHOD AND REDUCTION SOLUTION FOR METALLIZING A SURFACE

FIELD OF THE INVENTION

The present application is generally related to the field of metallizing substances, and more particularly to a process for metallizing a substance using a reduction solution to produce catalytic islands.

BACKGROUND OF THE INVENTION

A process for selectively metallizing a circuit board is described in U.S. Pat. No. 5,162,144, (assigned to the same assignee as the present application) and hereby incorporated by reference. This process is used in conjunction with a two dielectric layered, sequentially processed circuit board, as described in U.S. Pat. No. 5,260,170 (assigned to the same assignee as the present application). This circuit board process consists of the sequential deposition and photo-definition of openings in two resins. The first resin, called resin A, is filled with a material referred to herein as a filler, which when activated, will promote electroless plating with a metal. The second resin, called resin B, does not contain such a filler. When each resin, in turn, is photochemically patterned, resin B over resin A, openings produced in resin B define areas called "channels"; superimposed openings produced in resin A and resin B define deeper areas called "wells" which open to a metal layer below. When this structure is subjected to processes which modify or activate particles contained in or at the surface of resin A, the channels and wells may be coated with an electroless plated metal to form metallic features, such as pads, vias and conductors.

In building the circuit board it is important that the electroless plated metal stay confined to the defined pads, vias and conductors. Otherwise the circuit board will contain shorts and other undesirable properties. One process for activating the particles at the surface of resin A involved immersing the circuit board in a reducing agent of borohydride. In the preferred case, the particles in resin A are $Cu_2O$ particles at a concentration of less than 10% by weight of dry resin. When the $Cu_2O$ particles are exposed to the borohydride, the $Cu_2O$ particles are converted to Cu or CuH. When the copper is in this active state (Cu, CuH) it is catalytic to electroless plating. Given the limited amount of particles in resin A there is an insufficient number of catalytic sites for the electroless plating to form continuous lines, as required to form conductors.

For continuous production applications where circuit boards are carried by a conveyor belt it is necessary to be able to apply the reducing agent in a suitable manner, i.e. spraying. Spraying has the advantageous effect of spreading the active copper away from the particle sites. This spreading allows the formation of continuous conductors. However, the spreading is not confined to the exposed resin A areas. As a result, bridging occurs when the spraying operation is not carefully applied to the defined pads, vias and conductors. The controlled spraying works in the laboratory but is impractical for the production environment. As a result, there exists a need for a method and a reducing solution that forms large catalytic islands on resin A without the catalytic islands forming on resin B to produce finely space conductors, vias and pads.

DESCRIPTION OF THE PREFERRED EMBODIMENT

Figure 1:
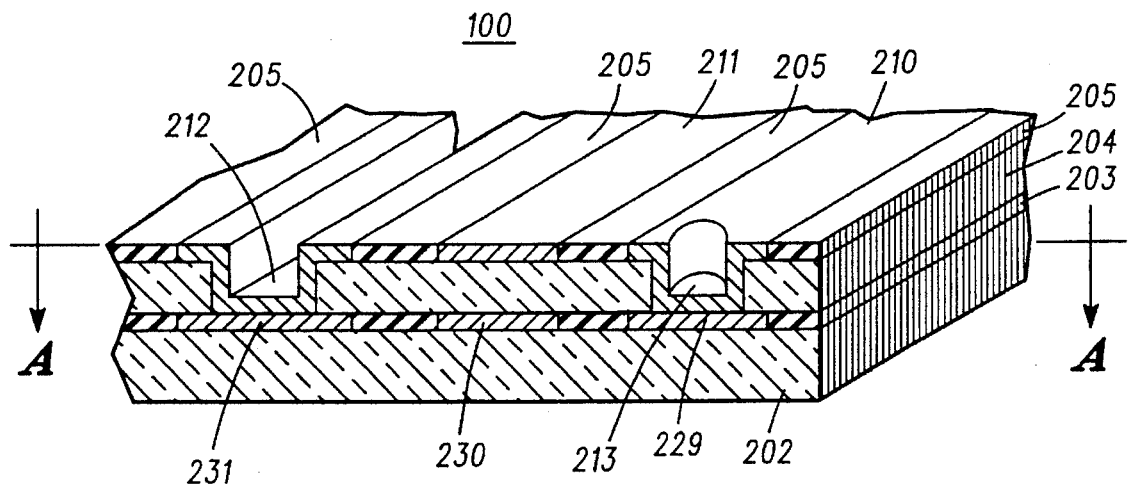
FIG. 1 is a partial perspective view of a circuit board 100, which has been selectively metallized by utilizing the process of the present invention.

Referring to FIG. 1, there is illustrated a partial perspective view of a circuit board 100, which has been selectively metallized by utilizing the process and reducing solution of the present invention. Circuit board 100 may be a multi-layer circuit board as illustrated, or may be a two-sided circuit board with circuitry on the top surface and the bottom surface. Furthermore, the process of the present invention may be used to metallize plastics and other conventional substrates, which have flat surfaces or three-dimensional surfaces.

Figure 6:
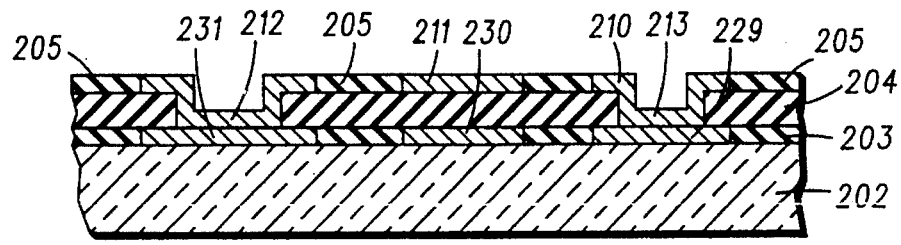
FIG. 6 is another cross-sectional view of circuit board 100 in FIG. 1 taken along line A—A, during the manufacture thereof.

Circuit board 100 in FIG. 1 includes conductors 210, 211, 212 and is comprised of a substrate 202 having one or more circuitry layers 203, resin 204 disposed on circuitry layer 203, and resin 205 disposed on resin 204, as shown in more detail in the cross-sectional view in FIG. 6. Conductors 210 and 211 are disposed in corresponding openings or "channels" in resin 205 as shown in FIG. 1 and FIG. 6. Conductor 212 is disposed in a deep channel in resin 205 and resin 204 and electrically connects to conductor 231. Via 213 is disposed in a opening or "well" in resin 205 and resin 204 and electrically connects to conductor 229. Circuitry layer 203 includes conductors 229, 230 and 231.

Substrate 202 is comprised of an insulating material, such as, for example, plastic, wood, composite, mylar, ceramic, a metal covered by an insulating layer, or any other suitable insulating composition of matter. Resins 204 and 205 may be any suitable resin such as one of or a mixture of a thermoplastic resin, thermoset resin, elastomer, composite, or laminate, one of a mixture of a polyolefin, vinyl, polystyrene, polyamide, acrylic, polyurethane, or saturated polyester thermoplastic resin, or one of a mixture of a hardened phenolic, unsaturated polyester, epoxy, or polyimide prepolymer.

Figure 7:
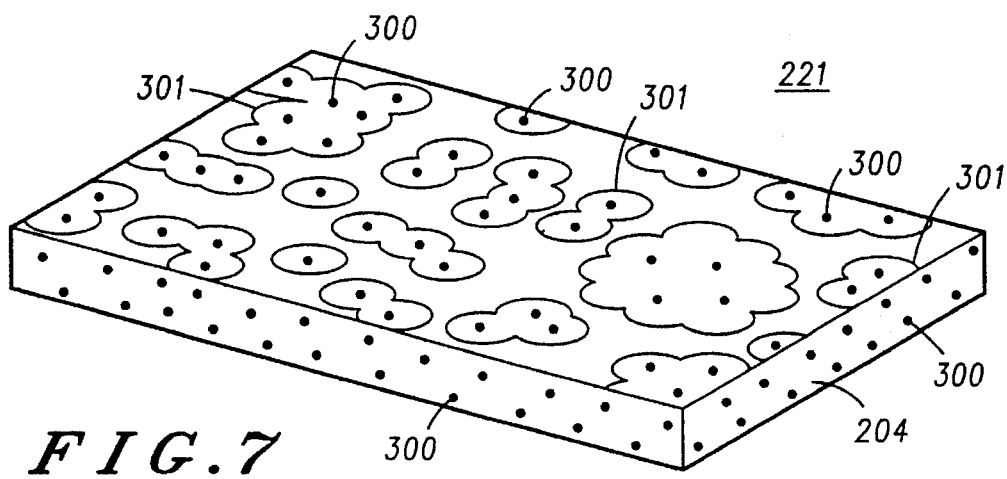
FIG. 7 is an enlarged view of the surface of channel 221 of the circuit board 100 in FIG. 5.

According to the present invention, resin 204 is substantially uniformly mixed with a plurality of small metal oxide particles such that the percentage by weight of said metal oxide is less than ten percent. When used in multi-layer circuit applications, resin 204 preferably has the following four characteristics: (1) no significant degradation of dielectric constant of the finished dielectric layer; (2) no significant degradation of bulk or surface resistivity away from areas which are plated; (3) no adverse effects on photochemical definition of the resin; and (4) no adverse effects on application or flow properties. In the preferred embodiment, cuprous oxide particles 300 in FIG. 7 are uniformly mixed with resin 204. Cuprous oxide has a dielectric constant of approximately 28. Resin 204 typically has a dielectric constant of approximately 2–5 without cuprous oxide, and a slightly higher dielectric constant when mixed with ten percent by weight of cuprous oxide. Although ten percent by weight of cuprous oxide is used in the preferred embodiment, a greater amount of cuprous oxide may be used in applications where the resultant increase in the dielectric constant of resin 204 is acceptable. Another filler is CAT-10 (TM), which is palladium absorbed on kaolin clay, manufactured and available from Johnson-Matthey in New Jersey, U.S.A. However, cuprous oxide is preferable over CAT-10, since CAT-10 has a relatively long (one hour plus) electroless plating initiation time because it only provides catalytic points. Initiation begins immediately with activated $Cu_2O$ and continuous copper plating typically occurs in less than fifteen minutes.

By utilizing the present invention, circuit boards 100 having conductors 210, 211, and 212 separated by approximately 25 micrometers or less may be manufactured. In addition, interconnecting vias of 25 micrometers in diameter can be mass produced. Pattern resolution is dictated by the photodefinition of the resin system and lithography process. Using cuprous oxide particles substantially uniformly mixed in resin 204, the dielectric constant of the circuit board is substantially the same as that of substrate 202 and the surface resistivity is at least $10^{13}$ ohms per square, since the percentage by weight of the cuprous oxide particles 300 is less than ten percent.

Figure 2:
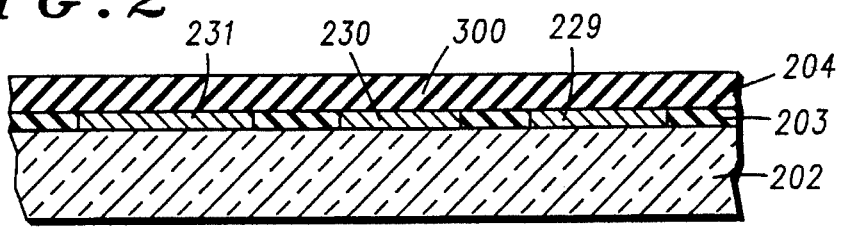
FIG. 2 is a cross-sectional view of circuit board 100 in FIG. 1 taken along line A—A, during the manufacture thereof.

Referring to FIGS. 2–6, there is illustrated a cross sectional view of circuit board 100 in FIG. 1 taken along line A—A, showing circuit board 100 at selected stages during the manufacture thereof. FIG. 6 corresponds to completed circuit board 100 in FIG. 1 without solder mask. First, as shown in FIG. 2, substrate 202 is metallized to form circuitry layer 203 or a preformed circuitry layer 203 is attached thereto, with conductors 229, 230 and 231. Next, substrate 202 and circuitry layer 203 are coated with resin 204. In the preferred embodiment, resin 204 is resin A of the aforementioned two dielectric process. Resin 204 is formed by uniformly mixing a selected resin with a plurality of small metal oxide particles 300 in FIG. 7, such that the percentage by weight of said metal oxide is less than ten percent. In the preferred embodiment, resin 204 is selected from the resins described hereinabove, and the metal-oxide particles 300 are cuprous oxide particles which preferably range in size from a diameter of 0.05 micrometers to a diameter of 10 micrometers.

Figure 3:
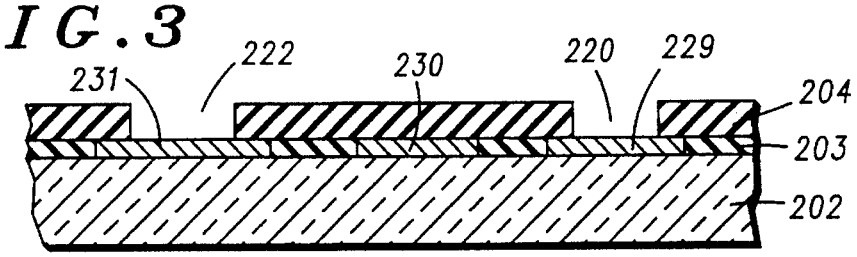
FIG. 3 is another cross-sectional view of circuit board 100 in FIG. 1 taken along line A—A, during the manufacture thereof.
Figure 4:
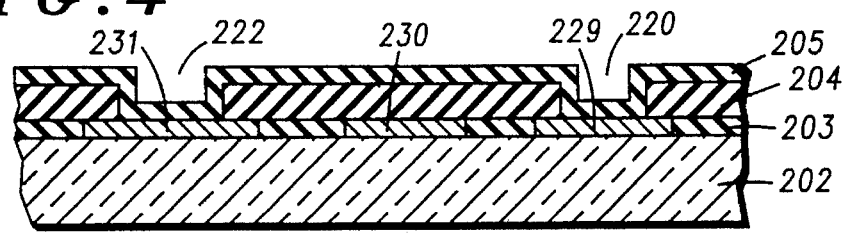
FIG. 4 is another cross-sectional view of circuit board 100 in FIG. 1 taken along line A—A, during the manufacture thereof.
Figure 5:
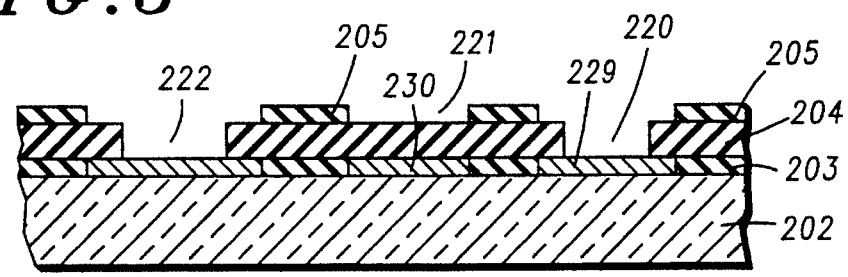
FIG. 5 is another cross-sectional view of circuit board 100 in FIG. 1 taken along line A—A, during the manufacture thereof.

In FIG. 3, resin 204 is photo-patterned creating channel 222 and well 220 exposing corresponding conductors 231 and 229, respectively, of circuitry layer 203. In FIG. 4, resin 204, channel 222 and well 220 are coated with resin 205. In the preferred embodiment, resin 205 is resin B of the aforementioned two dielectric process and likewise is selected from the resins described hereinabove. In FIG. 5, resin 205 is photo-patterned creating channel 221 and re-opening channel 222 and well 220. Next, the metal oxide particles 300 near the exposed surface of resin 204 (see FIG. 7) are exposed by a suitable treatment, such as alkaline permanganate or reactive ion etching. Then, a reducing solution is applied (explained in more detail hereinbelow) by spraying (or other suitable application means) the surface of channels 221 and 222 and well 220 to convert the exposed metal oxide particles 300 at the surface of resin 204 to island areas 301 of catalytic film (catalytic islands) having a surface resistivity greater than $10^6$ ohms per square. Thereafter, channels 221 and 222 and well 220 are suitably treated and electrolessly metallized to form conductors 210, 211 and 212 and via 213 in FIG. 1 and FIG. 6, having a surface metallization thickness of approximately 10 micrometers.

The reduction solution is applied to the $Cu_2O$ particles 300 to form islands of active copper, either Cu or CuH. These islands 301 are the catalysts for copper deposition by the electroless bath. The reduction solution contains three elements; 1) a primary reduction agent, 2) a secondary reduction agent and 3) a capturing agent. The primary reduction agent selectively reduces the copper in the plus one oxidation state, $Cu^+$. The preferred primary reducing agent is sodium borohydride, $NaBH_4$. The secondary reduction agent reacts preferable with the copper in the plus two oxidation state, $Cu^{++}$, and reduces it to the plus one oxidation state, $Cu^+$. The preferred secondary reduction agent is sodium iodide, NaI. The capturing agent is a chelate or complexing agent, which holds the plus two oxidation state of copper in solution, $Cu^{++}$. The preferred capturing agent is EDTA.

In the preferred embodiment, the reduction solution is mixed so that there is a concentration of 0.001 to 1.0 molar of sodium borohydride, $NaBH_4$, 0.0 to 0.25 molar concentration of sodium iodide, NaI, and 0.0 to 0.25 molar concentration of EDTA. Sodium hydroxide, NaOH, is added to the solution to produce a pH of at least 10. The higher pH stabilizes the sodium borohydride, $NaBH_4$, which results in less catalytic island 301 coverage. With increasing pH the iodide is less active. Lower pH's result in uncontrolled growth of the catalytic islands 301 due to $NaBH_4$ decomposition and protonation of the EDTA. This reduction solution results in the catalytic island 301 size stabilizing after a relatively brief period of time. Spraying the reducing solution onto the circuit board 100 does not result in splattering or excessive spreading of the catalytic material.

The chemical reactions of the various species of the reduction solution occur as follows. When the reduction solution contacts resin 204 the capturing agent EDTA continuously dissolves and traps a portion of each exposed metal oxide, $Cu_2O$, particle 300. Simultaneously, the primary reducing agent, $NaBH_4$, converts some of the surface of each metal oxide particle to catalytic sites that are active to electroless plating. Meanwhile, the captured metal ion in solution is mobile and can be distributed over some distance while in solution. The secondary reducing agent, NaI, reduces the oxidation state of the captured metal ion which weakens the bond between the captured agent and metal ion. When this weakened species contacts a catalytic particle in the presence of additional primary reducing agent, the active particle triggers further metal ion reduction of the weakened mobile species. Metal deposition occurs around the active particles which act as nucleation sites for film growth. After a short period, less than five minutes, a steady state is achieved between the metal species dissolving and depositing. The result is island structures which form only around the original particles. Forming catalytic islands is a necessary feature to successfully produce conductor patterns.

EXAMPLES

1. Samples were prepared of a two dielectric layered, sequentially processed circuit board, as described in U.S. Pat. No. 5,260,170. One set of samples were placed in an 0.015 molar borohydride only reduction solution of for 10 seconds, one minute and five minutes and a second set of samples were placed in an 0.015 molar borohydride and 0.25 molar EDTA reduction solution for the same time periods. Both reduction solution had a pH of 12. Then the samples were rinsed with deionized water. Immediately there after the samples were placed in an ionic palladium solution for ten seconds. Next, the samples were rinsed and dried. Last the samples were plated in a Shipley 4500 electroless copper bath for two minutes. The samples were viewed with a scanning electron microscope to determine where plating had initiated. The measurement criteria is a visual determination of the density of the initiation sites on the surface of the sample.

The purpose of the palladium treatment and electroless bath was to allow viewing of the catalytic islands. The results for the three borohydride only reduction samples was a low density initiation sites. There was only a slight increase in initiation sites density with the increase in reduction time.

The borohydride and EDTA reduction sample that was reduced for ten seconds showed a similar initiation density as the borohydride only reduction. While the one minute borohydride and EDTA reduction sample showed a marked increase in initiation sites and the five minute reduction sample showed almost continuous plating.

2. A second set of samples were prepared of a two dielectric layered, sequentially processed circuit board, as described in U.S. Pat. No. 5,260,170. These samples were reduced in three different reduction chemistries: 1) 0.015 molar $NaBH_4$ 2) 0.015 molar $NaBH_4$ and 0.25 molar EDTA and 3) 0.014 molar $NaBH_4$, 0.025 molar EDTA and KI. All threereduction chemistries had a pH of 12. The samples were dipped in the reduction chemisty for ten seconds, one minute, five minutes and fifteen minutes. Then the samples were rinsed with deionized water. Immediately there after the samples were placed in an ionic palladium solution for ten seconds. Next, the samples were rinsed and dried. Last the samples were plated in a Shipley 4500 electroless copper bath for two minutes. The samples were viewed with optical microscope for selective plating and overplating.

The borohydride only redution showed no plating at ten seconds and one minute. Selective plating was found at five minutes and fifteen minutes and coverage increased with increased reduction time. No overplating was observed on any of the samples.

The borohydride and EDTA reduction showed no plating at ten seconds, selective plating at one minute, five minutes and fifteen minutes. The coverage increased with time and no overplating was observed on any of the samples.

Finally, the borohydride, EDTA and KI showed selective plating at ten seconds, one minute and five minutes. Over plating was observed at fifteen minutes. Coverage increased with time in all samples.

In summary, the present invention provides a method and reducing solution suitable for producing catalytic islands 301 on a two dielectric layered sequentially processed circuit board in a production environment. Using this method and reducing solution, finely spaced conductors, pads and vias can be created on a circuit board, without bridging.

What is claimed is:

1. A process for metallizing a surface of a substrate, said process comprising the steps of:

forming a circuitry layer on the surface;

coating the surface and circuitry layer with a first resin, wherein the first resin includes a plurality of small metal oxide particles;

photo-patterning and developing the first resin to form a first set of openings in the first resin to expose a portion of the circuitry layer;

coating the first resin and the exposed portion of the circuitry layer with a second resin;

photo-patterning and developing the second resin to form a second set of openings in the second resin to re-expose the portion of the circuitry layer and expose a portion of the first resin;

uncovering the small metal oxide particles near the exposed portion of the first resin;

applying an aqueous reducing solution including,
        a borohydride capable of reducing the metal oxide particles in their plus one oxidation state;
        an iodide capable of reducing the metal oxide particles from their plus two to plus one oxidation state, and EDTA, to the exposed portion of the first resin for converting the uncovered metal oxide particles to island areas of catalytic film; and electrolessly metallizing the re-exposed portion of the circuitry layer and the exposed portion of the first resin.

2. The process of claim 1, wherein the aqueous reducing solution further includes a hydroxide to produce a pH of 10 or greater.

3. The process of claim 1, wherein the small metal oxide particles consist of cuprous oxide.

4. The process of claim 1, wherein the step of uncovering the small metal oxide particles is performed by reactive ion etching.

5. The process of claim 1, wherein the borohydride has a concentration from 0.001 to 1.0 molar, the iodide has a concentration from 0.001 to 0.25 molar, and the EDTA has a concentration from 0.001 to 0.25 molar.

6. The process of claim 1, wherein the island areas of catalytic film have a surface resistivity greater than $10^6$ ohms per square.

* * * * *